United States Patent

Bae

Patent Number: 5,668,042
Date of Patent: Sep. 16, 1997

[54] METHOD FOR ALIGNING MICRO PATTERNS OF A SEMICONDUCTOR DEVICE

[75] Inventor: Sang Man Bae, Kyoungki-do, Rep. of Korea

[73] Assignee: Hyundai Electronics Industries Co., Ltr., Kyoungki-do, Rep. of Korea

[21] Appl. No.: 722,877

[22] Filed: Sep. 26, 1996

[30] Foreign Application Priority Data

Sep. 29, 1995 [KR] Rep. of Korea ............ 95-33160

[51] Int. Cl.$^6$ ............ H01L 21/70; H01L 27/00
[52] U.S. Cl. ............ 438/18; 148/DIG. 106; 438/725
[58] Field of Search ............ 437/924, 60; 148/DIG. 106, 148/DIG. 102

[56] References Cited

U.S. PATENT DOCUMENTS

| | | | |
|---|---|---|---|
| 4,712,016 | 12/1987 | Matsumura | 250/548 |
| 5,316,966 | 5/1994 | Wan Der Plas et al. | 437/70 |
| 5,545,570 | 8/1996 | Chung et al. | 437/229 |
| 5,545,593 | 8/1996 | Watkins et al. | 437/225 |

*Primary Examiner*—Jey Tsai
*Attorney, Agent, or Firm*—Gary M. Nath; Nath & Associates

[57] ABSTRACT

A method for aligning micro patterns of a semiconductor device, capable of reducing the number of dies having poor quality in the formation of patterns, thereby achieving an improvement in operation reliability of the semiconductor device. The method of the present invention utilizes the fact that even in the case of a semiconductor wafer having alignment marks damaged due to an error occurring in the formation or etching of thin films, outer mark portions of its overlay measuring marks can be observed. For several dies sampled as observation dies from the semiconductor wafer, light exposure is carried out to form photoresist film patterns under the condition that the semiconductor wafer is misaligned from the light exposure mask. Thereafter, alignment marks and inner mark portions of overlay measuring marks are formed. A misalignment angle $\theta$ between the semiconductor wafer and light exposure mask is also calculated. In the stepper, the degree of misalignment is then corrected based on the result of the calculation. In this state, subsequent processes are conducted for normal dies other than the observation dies. Accordingly, it is possible to reduce the number of dies which are considered as having a poor quality, thereby achieving an improvement in operation reliability of the semiconductor device.

12 Claims, 2 Drawing Sheets

METHOD FOR ALIGNING MICRO PATTERNS OF A SEMICONDUCTOR DEVICE

BACKGROUND OF THE INVENTION

1. Field of the Invention

The present invention relates to a method for fabricating a semiconductor device, and more particularly to a method for aligning micro patterns of a semiconductor device, capable of reducing the number of dies having poor quality in the formation of patterns, thereby achieving an improvement in operation reliability of the semiconductor device.

2. Description of the Prior Art

In the fabrication of semiconductor devices, in particular, highly integrated semiconductor devices, a complex process using a plurality of overlapping light exposure masks is generally used. The layer-to-layer alignment among the light exposure masks used in respective steps of the fabrication process is conducted with respect to a mark having a particular shape.

Such a mark is called "alignment key" or "alignment mark".

The mark is used for the layer-to-layer alignment between different masks or alignment of dies with a mask.

Steppers, which is a step and repeat type illumination device used in the fabrication of semiconductor devices, is a device in which light exposure is conducted as its stage repeatedly performs alignment of a wafer while moving X-Y directions. The stage automatically or manually conducts the alignment of the wafer with reference to an alignment mark.

Since the stage operates mechanically, an error in alignment may be generated while the fabrication process is repetitively carried out. When such an alignment error exceeds its allowable range, the semiconductor devices which are finally obtained may have poor quality.

The overlay accuracy based on misalignment may be adjusted in accordance with the design rule of the semiconductor device. The adjustment ranges from 0 to 30% of a general design rule.

The overlay accuracy measuring mark or overlay measuring mark are used in the same manner as the alignment mark to check whether layers laminated on a semiconductor substrate are accurately aligned with one another.

Conventionally, such an alignment mark or overlay measuring mark is formed on the scribe line of a wafer where no chip is disposed.

The measurement of misalignment using alignment marks is carried out in accordance with either a visual checking method using vernier alignment marks or an automatic checking method using box-in-box or box-in-bar alignment marks. The misalignment is compensated for, based on the result of the measurement.

In the case of a highly integrated semiconductor device, its chip has a dimension of about 15 to 25 mm at its each edge.

For the fabrication of a semiconductor device, a masking process should be conducted tens of times. For this reason, the overlay accuracy measuring mark formed on the scribe line may have indistinct outlines as several subsequent processes are conducted. In severe cases, the overlay accuracy measuring mark itself may be damaged. As a result, inaccurate measurement may be carried out.

For highly integrated semiconductor devices requiring the use of a number of light exposure masks, it is necessary to measure the overlay accuracy between laminated layers. In this case, a plurality of overlay measuring marks are formed on the scribe line. The overlay measuring marks have a size of about 20×20 μm$^2$. For the fabrication of 256 Mega DRAM's, at least 30 overlay measuring marks having the above-mentioned size are required.

In this connection, a conventional method for aligning misaligned micro patterns of a semiconductor device will now be described in conjunction with FIGS. 1 and 2.

FIG. 1 is a schematic view explaining a conventional method for aligning micro patterns of a semiconductor device. On the other hand, FIG. 2 is an enlarged plan view showing measuring marks formed on a die of the semiconductor device of FIG. 1 in accordance with the conventional method.

As shown in FIG. 1, patterns are formed on portions of a semiconductor wafer 1 respectively defined as predetermined dies 2 by sequentially conducting a light exposure process for those dies in a step-and-repeat manner using a stepper.

Alignment marks respectively formed on portions of dies 2 defined as scribe lines on the semiconductor wafer 1 are read by the stepper. Based on the result of the reading, a light exposure mask, which is used for the light exposure process, is aligned with the semiconductor wafer 1.

In this case, the alignment marks have a square shape with a dimension of about 4 μm.

When a misalignment occurs between the die 2A where a pattern will be formed and the die 2B where the pattern has been formed, it is measured using an overlay measuring mark (not shown) formed on one side of the associated alignment mark. The overlay measuring mark consists of an inner measuring mark and an outer measuring mark both having a square shape. The inner measuring mark has a dimension of 10 μm at its each edge whereas the outer measuring mark has a dimension of 20 μm at its each edge.

Thereafter, the distance between the inner and outer measuring marks is measured at their facing edges. That is, distances X1, X2, Y1 and Y2 are measured. Based on the measured distances, degrees of misalignment along X and Y-axes are calculated. The degree of misalignment $\delta X$ along the X-axis is calculated by the equation: $\delta X = X2 - X1$ whereas the degree of misalignment $\delta Y$ along the Y-axis is calculated by the equation: $\delta Y = Y2 - Y1$.

The measured values for the overlay measuring marks respectively formed at four edges of each die are averaged so as to calculate a misalignment angle $\theta$ between the semiconductor wafer and light exposure mask.

The inner and outer measuring marks correspond to masks, respectively.

Light having a certain wavelength is irradiated onto the measuring marks. Light beams respectively reflecting from the measuring marks are sensed by a photo image sensor board on which a plurality of photo sensors are arranged in a matrix array.

The sensed light is then measured and analyzed by a measurement device including a photo signal detector and an overlay accuracy data analyzer.

Based on the result of the analysis, degrees of misalignment $\delta X$ and $\delta Y$ along the X and Y-axes are calculated ($\delta X = X2 - X1$; and $\delta Y = Y2 - Y1$), thereby obtaining correction values for X and Y-axes.

In this case, data obtained for corner portions of each mark is not used in order to avoid a confusion between the data. In this regard, only data obtained for opposite lateral edges of each mark is used as a measured value.

However, the above-mentioned conventional method has various problems.

In accordance with the conventional method, the process can advance normally when alignment marks on the semiconductor wafer are observed. However, where such measuring marks are damaged or lost due to an error occurring upon conducting a desired process such as thin film deposition or etching process, the reading of measuring marks is disenabled over the entire semiconductor wafer. In this case, all dies formed on the semiconductor wafer are considered as having a poor quality. In the case of a 6-inch wafer, about 30 to 40 dies are considered as having poor quality even when one measuring mark is not observed.

Since such a semiconductor wafer, which has alignment marks damaged or lost due to an error in the process as used, is considered as having poor quality in accordance with the above-mentioned conventional method, a reduction in process yield occurs.

An increase in manufacturing cost also occurs because several processes have to be conducted for a semiconductor wafer considered to be a poor-quality product.

In particular, the process error resulting in a damage of alignment marks is mainly generated upon conducting a metal wiring process which is a final process in the fabrication of semiconductor devices. As a result, the process yield is greatly reduced.

SUMMARY OF THE INVENTION

Therefore, an object of the invention is to solve the above-mentioned problems involved in the conventional method and to provide a method for aligning micro patterns of a semiconductor device, capable of reducing the number of dies having poor quality in the formation of patterns, thereby achieving an improvement in operation reliability of the semiconductor device.

In accordance with the present invention, this object is accomplished through a method for aligning micro patterns of a semiconductor device, comprising the steps of: preparing a semiconductor wafer provided with a plurality of dies and selected mark portions of overlay measuring marks; forming a first etchable layer serving to provide desired patterns, over the semiconductor wafer; forming, on portions of the first etchable layer respectively disposed over selected ones of the dies, first photoresist film patterns serving as an etch mask for the patterns which will be provided by the first etchable layer; selectively removing the first etchable layer by use of the first photoresist film patterns as a mask, thereby forming patterns of the first etchable layer which provide the remaining mark portions of the overlay measuring marks and alignment marks arranged on one side of the overlay measuring marks; removing the first photoresist film patterns; measuring the degree of misalignment for the selected dies by use of the overlay measuring marks which includes inner and outer marks provided by the selected and remaining mark portions; forming a second etchable layer over the entire upper surface of the resulting structure obtained after the removal of the first photoresist film patterns; forming second photoresist film patterns on portions of the second etchable layer disposed over normal ones of the dies other than the selected dies by use of the same light exposure mask as used in the formation of the first photoresist film patterns, under the condition in which a misalignment between the semiconductor wafer and the light exposure mask is corrected based on the measured degree of misalignment by a stepper stored with positions of the alignment marks in its working files; and etching the second etchable layer by use of the second photoresist film patterns as a mask, thereby forming patterns of the second etchable layer.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
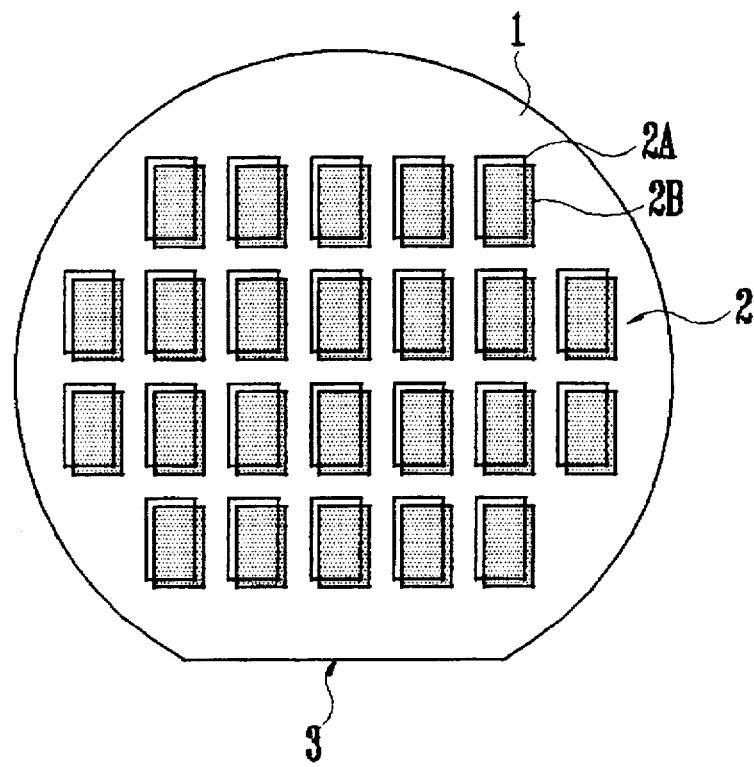
FIG. 1 is a schematic view explaining a conventional method for aligning micro patterns of a semiconductor device.
Figure 2:
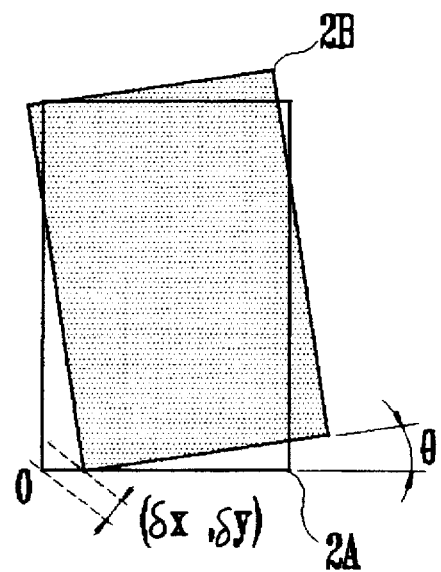
FIG. 2 is an enlarged plan view showing measuring marks formed on a die of the semiconductor device of FIG. 1 in accordance With the conventional method.
Figure 3:
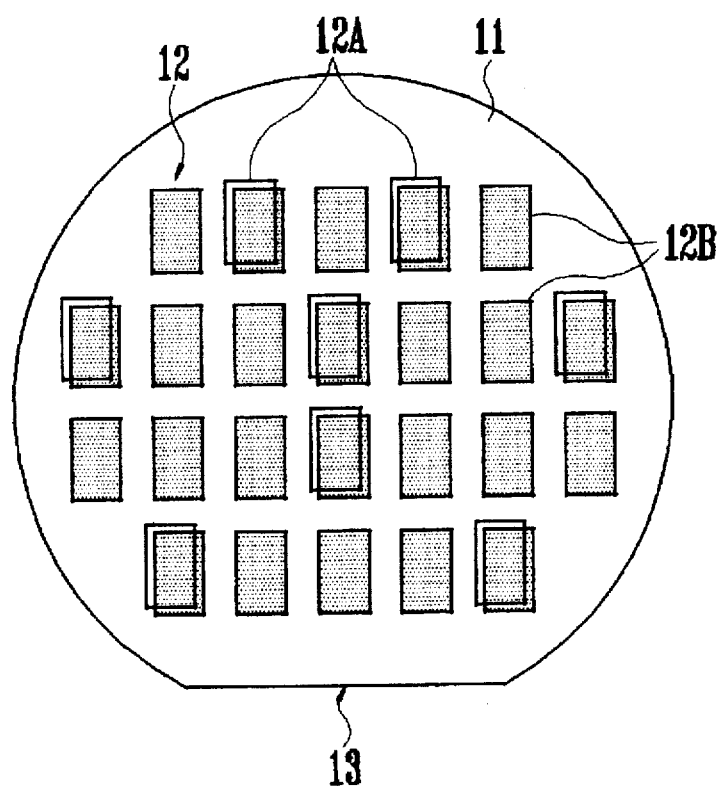
FIG. 3 is a schematic view explaining a method for aligning micro patterns of a semiconductor device in accordance with the present invention.
Figure 4:
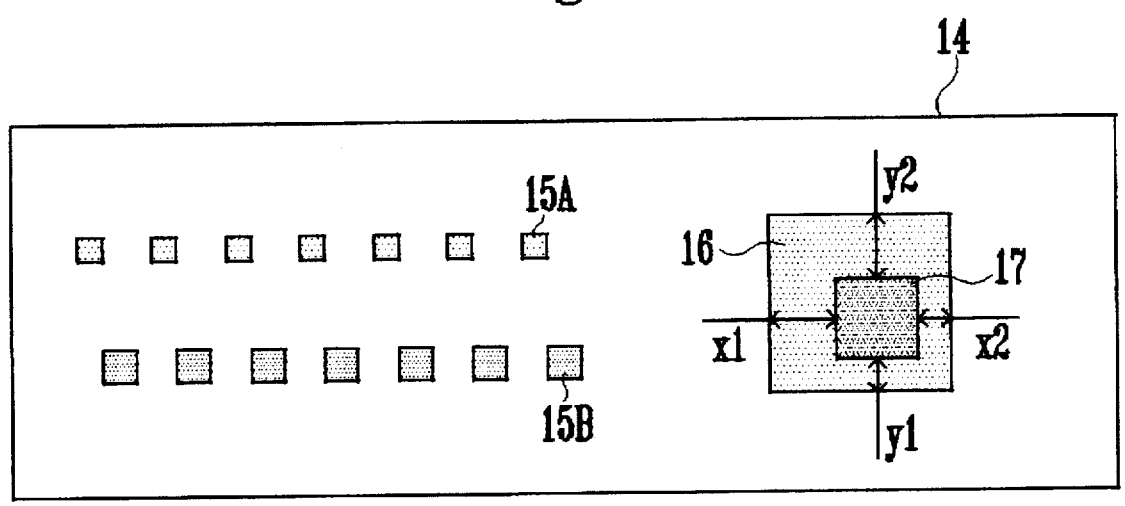
FIG. 4 is an enlarged plan view showing measuring marks formed on the semiconductor device of FIG. 3 in accordance with the present invention.

FIG. 3 is a schematic view explaining a method for aligning micro patterns of a semiconductor device in accordance with the present invention. On the other hand, FIG. 4 is an enlarged plan view showing measuring marks formed on the semiconductor device of FIG. 3 in accordance with the present invention.

In accordance with the present invention, an etchable layer (not shown) and a photoresist film (not shown) are sequentially formed over a semiconductor wafer 11. As shown in FIG. 3, the semiconductor wafer 11 has a plurality of dies 12 provided with a desired under structure including element-isolating oxide films, word lines, bit lines and capacitors.

The semiconductor wafer 11 is also provided at its portions corresponding to scribe lines 14 with alignment marks and overlay measuring marks. The alignment marks, which are denoted by the reference numeral 15A in FIG. 4, are formed at a processing step just prior to an initial processing step for, for example, forming element-isolating oxide films. The alignment marks 15A may have an optional size of, for example, about $4\times4$ $\mu m^2$, $6\times6$ $\mu m^2$ or $4\times12$ $\mu m^2$. On the other hand, the overlay measuring marks are formed at the initial processing steps. Referring to FIG. 4, outer mark portions 16 of the overlay measuring marks are shown.

Since the alignment marks 15A have a small size, they may be damaged due to an error occurring in the formation or etching of thin films. In this case, it is impossible to observe the alignment marks. The following description will be made in conjunction with the case wherein the alignment marks are damaged as mentioned above.

In accordance with the present invention, the semiconductor wafer 11 having the above-mentioned structure is loaded in a stepper (not shown) so that it can be exposed to light.

The alignment marks 15A are damaged upon conducting the light exposure process, so that they can not be observed.

In accordance with the method of the present invention, several (10 or less) dies 12A are first sampled as observation dies from the semiconductor wafer 11. For the sampled dies 12A, light exposure is carried out to form photoresist film patterns under the condition in which the semiconductor wafer 11 is misaligned from a light exposure mask (not shown) by a distance of 0.1 to 5 $\mu m$, that is, about 2 to 20 times an allowable alignment error of about 0.05 $\mu m$. This process is conducted without observing the alignment marks 15A because the alignment marks 15A can not be observed.

Thereafter, the etchable layer, which has been formed over the semiconductor wafer 11, is etched using the photoresist film patterns, thereby forming etchable layer patterns. The photoresist film patterns are then removed.

Simultaneously with the formation of the etchable layer patterns, alignment marks 15B and inner mark portions 17 of overlay measuring marks are formed on the scribe line 14. The alignment marks 15B are spaced apart from the inner marks 17 by a distance of about 100 µm or more. Although the etchable layer patterns are formed while being misaligned by an error larger than the allowable alignment error, the degree of misalignment is limited to a certain level because the stepper itself performs a basic alignment with respect to the cut surface 13 of the semiconductor wafer 11. Meanwhile, the outer marks 16 as previously formed have a large size of about 20×20 µm² whereas the inner marks 17 have a small size of about 10×10 µm². Accordingly, the inner marks 17 are formed on the inside of the associated outer marks 16 even when the degree of misalignment ranges ±5 µm in X-Y axis directions.

The outer marks 16 can be observed because they are formed to have a very large step at the initial processing step.

Thereafter, the distance between the outer and inner marks 16 and 17 is measured at their facing edges. That is, distances X1, X2, Y1 and Y2 are measured. Based on the measured distances, degrees of misalignment between the semiconductor wafer and light exposure mask along X and Y-axes are calculated. The degree of misalignment δX along the X-axis is calculated by the equation: δX=X2–X1 whereas the degree of misalignment δY along the Y-axis is calculated by the equation: δY=Y2–Y1. At this time, a misalignment angle θ between the semiconductor wafer and light exposure mask is also calculated.

Over the semiconductor wafer 11 having the above-mentioned structure, an etchable layer (not shown) and a photoresist film (not shown) are then sequentially formed. Thereafter, the degree of misalignment is corrected based on the result of the above-mentioned calculation. In this state, normal dies 12B other than the observation dies 12A are selectively exposed to light, thereby forming photoresist film patterns. In this case, the stepper uses the same light exposure mask as used in the previous light exposure process. The stepper is also stored with the positions of the previously formed alignment marks 15B in its working file. That is, the stepper conducts its light exposure operation while correcting the positions of alignment marks 15B by the degree of misalignment as calculated.

Using the photoresist film patterns as a mask, the etchable layer is then etched at its portions not covered with the photoresist film patterns, thereby forming etchable layer patterns.

The etchable layer patterns are normally aligned patterns. Accordingly, the normal dies 12B are patterned without involving any error.

As is apparent from the above description, the method of the present invention provides various effects.

The method of the present invention utilizes the fact that even in the case of a semiconductor wafer having alignment marks damaged due to an error occurring in the formation or etching of thin films, outer mark portions of its overlay measuring marks can be observed. For several dies sampled as observation dies from the semiconductor wafer, light exposure is carried out to form photoresist film patterns under the condition that the semiconductor wafer is misaligned from the light exposure mask. Thereafter, alignment marks and inner mark portions of overlay measuring marks are formed. A misalignment angle θ between the semiconductor wafer and light exposure mask is also calculated. In the stepper, the degree of misalignment is then corrected based on the result of the calculation. In this state, subsequent processes are conducted for normal dies other than the observation dies. Accordingly, it is possible to reduce the number of dies which are considered as having poor quality, thereby achieving an improvement in operation reliability of the semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for aligning micro patterns of a semiconductor device, comprising the steps of:

preparing a semiconductor wafer provided with a plurality of dies and selected mark portions of overlay measuring marks;

forming a first etchable layer serving to provide desired patterns, over the semiconductor wafer;

forming, on portions of the first etchable layer respectively disposed over selected portions of the dies, first photoresist film patterns serving as an etch mask for the patterns which will be provided by the first etchable layer;

selectively removing the first etchable layer by use of the first photoresist film patterns as a mask, thereby forming patterns of the first etchable layer which provide the remaining mark portions of the overlay measuring marks and alignment marks arranged on one side of the overlay measuring marks;

removing the first photoresist film patterns;

measuring the degree of misalignment for the selected dies by use of the overlay measuring marks which includes inner and outer marks provided by the selected and remaining mark portions;

forming a second etchable layer over the entire upper surface of the resulting structure obtained after the removal of the first photoresist film patterns;

forming second photoresist film patterns on portions of the second etchable layer disposed over normal portions of the dies other than the selected dies by use of the same light exposure mask as used in the formation of the first photoresist film patterns, under the condition in which a misalignment between the semiconductor wafer and the light exposure mask is corrected based on the measured degree of misalignment by a stepper stored with positions of the alignment marks in its working files; and etching the second etchable layer by use of the second photoresist film patterns as a mask, thereby forming patterns of the second etchable layer.

2. The method in accordance with claim 1, wherein the alignment marks and the overlay measuring marks are formed on a scribe line of each die.

3. The method in accordance with claim 1, wherein the alignment marks have a size ranging from 4×4 µm² to 5×5 µm².

4. The method in accordance with claim 1, wherein the alignment marks have a size of about 6×6 μm².

5. The method in accordance with claim 1, wherein the alignment marks have a size of about 4×12 μm².

6. The method in accordance with claim 1, wherein the outer mark portions of the overlay measuring marks have a size of about 20×20 μm².

7. The method in accordance with claim 1, wherein the inner mark portions of the overlay measuring marks have a size of about 10×10 μm².

8. The method in accordance with claim 1, wherein the formation of the first photoresist film patterns is carried out under the condition that the selected dies that are 10 or less in number have a degree of misalignment corresponding to 2 to 20 times an allowable alignment error.

9. The method in accordance with claim 1, wherein the alignment marks are spaced apart from the overlay measuring marks by a distance of about 100 μm or more.

10. The method in accordance with claim 1, wherein the degree of misalignment ranges ±5 μm in X-Y axis directions.

11. The method in accordance with claim 1, wherein the degree of misalignment in X-axis direction and the degree of misalignment in Y-axis direction are measured by calculating the distance between the inner and outer mark portions of each overlay measuring mark in X and Y-axis directions.

12. The method in accordance with claim 1, wherein the degree of misalignment includes a misalignment angle between the semiconductor wafer and the light exposure mask, which is obtained by averaging measured values of overlay measuring marks formed on four edges of each die.

* * * * *

UNITED STATES PATENT AND TRADEMARK OFFICE
CERTIFICATE OF CORRECTION

PATENT NO.   : 5,668,042

DATED        : Sep. 16, 1997

INVENTOR(S)  : Sang Man BAE

It is certified that error appears in the above-identified patent and that said Letters Patent is hereby corrected as shown below:

On the Title page, item [73]:
    Please change Assignee from "Hyundai Electronics Industries Co., Ltr." to --Hyundai Electronics Industries Co., Ltd.--

Signed and Sealed this

Twenty-third Day of December, 1997

Attest:

BRUCE LEHMAN

Attesting Officer

Commissioner of Patents and Trademarks